United States Patent
Barrow (10) Patent No.: US 8,004,339 B2
(45) Date of Patent: Aug. 23, 2011

(54) APPARATUSES AND METHODS FOR A LEVEL SHIFTER WITH REDUCED SHOOT-THROUGH CURRENT

(75) Inventor: Jeffrey G. Barrow, Tucson, AZ (US)

(73) Assignee: Integrated Device Technology, Inc., San Jose, CA (US)

( * ) Notice: Subject to any disclaimer, the term of this patent is extended or adjusted under 35 U.S.C. 154(b) by 0 days.

(21) Appl. No.: 12/622,266

(22) Filed: Nov. 19, 2009

(65) Prior Publication Data

US 2011/0115541 A1  May 19, 2011

(51) Int. Cl.
*H03L 5/00* (2006.01)
(52) U.S. Cl. .............................. 327/333; 326/63; 326/81
(58) Field of Classification Search .............. 326/62–63, 326/80–81; 327/306, 333
See application file for complete search history.

(56) References Cited

U.S. PATENT DOCUMENTS

| | | | |
|---|---|---|---|
| 5,559,464 A * | 9/1996 | Orii et al. ....................... | 327/333 |
| 6,049,228 A | 4/2000 | Moon | |
| 6,107,857 A | 8/2000 | Orisaka et al. | |
| 6,522,323 B1 | 2/2003 | Sasaki et al. | |
| 6,933,755 B2 * | 8/2005 | Hong et al. .................... | 327/108 |
| 7,071,758 B2 | 7/2006 | Tseng et al. | |
| 7,227,400 B1 * | 6/2007 | Gillespie et al. .............. | 327/333 |
| 7,397,278 B2 | 7/2008 | Nakao | |
| 2007/0164805 A1 | 7/2007 | Horibata et al. | |

* cited by examiner

*Primary Examiner* — Dinh T. Le
(74) *Attorney, Agent, or Firm* — Traskbritt, P.C.

(57) ABSTRACT

A level-shifting circuit with reduced shoot-through current includes an output circuit comprising high-voltage devices with a pull-up circuit configured for pulling up a voltage on an output signal to a high voltage responsive to a high-side control signal. The output circuit may also include a pull-down circuit configured for pulling down the voltage on the output signal to a low voltage in responsive to a low-side control signal. The level-shifting circuit can also include a high-side inverting buffer operably coupled between an edge-controlled signal and the high-side control signal, and a low-side buffer configured for driving the low-side control signal responsive to an input signal. The level-shifting circuit may also include an edge-control buffer operably coupled between the input signal and the high-side inverting buffer and configured to generate the edge-controlled signal with a slow rise time relative to a fall time.

24 Claims, 8 Drawing Sheets

APPARATUSES AND METHODS FOR A LEVEL SHIFTER WITH REDUCED SHOOT-THROUGH CURRENT

TECHNICAL FIELD

Embodiments of the present disclosure relate generally to voltage level-shifting and, more particularly, to apparatuses and methods related to high-voltage level shifters with reduced shoot-through current.

BACKGROUND

Level shift circuits (also referred to herein as level shifters) change the voltage level of a signal. For example, when an output voltage of a first circuit differs from an operating range of a second circuit, a level shifter is arranged between the first circuit and the second circuit, and the voltage level of the signal between the first and second circuits is adjusted. For example, in the driving circuitry for a liquid crystal display (LCD) panel, such as those using thin film transistors (TFT), signals having various voltages may be employed. In this case, signals having different voltages are generated from a common power supply and a level shift circuit is provided to adjust the levels of the signals between circuit blocks having different voltages.

Figure 1:
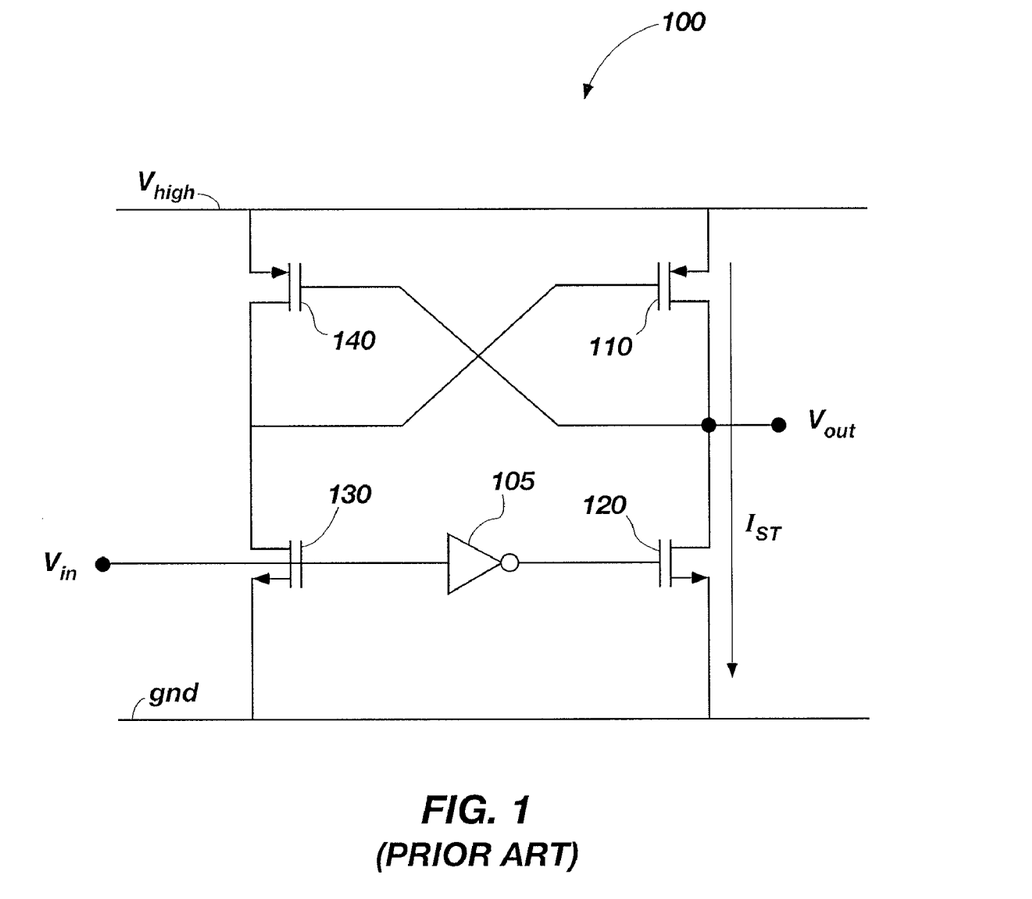
FIG. 1 illustrates a conventional level shifter.

FIG. 1 illustrates a conventional level shifter 100. Such a level shifter 100 may be common in integrated circuit (IC) processes in which the supply voltages do not exceed transistor maximum gate-to-source voltages (Vgs). Level shifter 100 includes PMOS transistor 110 operably coupled (e.g., connected) in series with NMOS transistor 120 such that the drains of the two transistors are operably coupled. The source of NMOS transistor 120 is operably coupled to ground. The source of the PMOS transistor 110 is operably coupled to the supply voltage ($V_{high}$). The supply voltage $V_{high}$ may also be referred to herein as the shift voltage, as it is the voltage that the level shifter 100 uses to adjust (i.e., shift) the voltage level on the output signal ($V_{out}$).

Level shifter 100 also includes NMOS transistor 130 operably coupled in series with PMOS transistor 140, such that the drains of the two transistors are operably coupled. The source of the PMOS transistor 140 is operably coupled to the supply voltage $V_{high}$. The source of NMOS transistor 130 is operably coupled to gnd (ground). PMOS transistor 110 and PMOS transistor 140 are cross coupled with the gates of each transistor operably coupled to the drain of the other transistor. An input signal ($V_{in}$) is applied to level shifter 100 at the gate of NMOS transistor 130. Input signal $V_{in}$ is also applied to an inverter 105 operably coupled to the gate of NMOS transistor 120.

In operation, when $V_{in}$ is asserted, NMOS transistor 120 is turned off. NMOS transistor 130 is turned on, which pulls the gate of PMOS transistor 140 to ground, turning on PMOS transistor 110. This causes the output signal ($V_{out}$) to be equal to $V_{high}$. When $V_{out}$ is equal to $V_{high}$, PMOS transistor 140 is held off, allowing PMOS transistor 110 to remain on. With $V_{in}$ asserted, the voltage level of an input signal $V_{in}$ is shifted to result in an output signal equal $V_{out}$ to $V_{high}$.

On the other hand, when $V_{in}$ is not asserted, NMOS transistor 120 is turned on, which causes $V_{out}$ to be pulled to ground. NMOS transistor 130 is not turned on which, in addition to the PMOS transistor 140 being held on, holds PMOS transistor 110 off by holding the supply voltage $V_{high}$ at the gate of PMOS transistor 110.

Level-shifting with conventional level shifter 100 may require little, if any, standby current. However, shoot-through current $I_{ST}$ may be possible during transitions of $V_{out}$, because low-side NMOS transistors 120 and 130 must overcome the current of high-side PMOS transistors 110 and 140, respectively, in order to switch (i.e., change or toggle) the output signal $V_{out}$. Shoot-through current $I_{ST}$ may arise when PMOS transistor 110 and NMOS transistor 120 are momentarily on due to asymmetries in the rise and fall times of the PMOS transistor 110 and the NMOS transistor 120. This mode of switching may also inhibit the transition time thereby increasing propagation delay and output slew rate.

The Vgs of the transistors is an important aspect of level-shifting circuits such as level shifter 100. These transistors may be required to standoff the entire supply voltage (i.e., shift voltage $V_{high}$). For level shifters with relatively low-voltages for a supply voltage, such a level shifter 100 may be sufficient. However, in high-voltage systems, (e.g., $V_{high}$ is 30V or more) the supply voltage may become more of a problem as present high performance transistors may not have a gate oxide able to standoff such high-voltages. High performance transistors may be defined as transistors with more current in less silicon area to have a low gate capacitance to operate at a higher speed.

Where the available supply voltages $V_{high}$ exceeds maximum transistor Vgs, conventional level shifter solutions may operate with a standby current to maintain the level shifter output state. As this standby current is reduced to lower power consumption, other parameters such as shoot-through current, propagation delay, and output slew rate may be adversely affected. There exists a need for a level shifter for high-voltage applications, which has low shoot-through current and/or minimal standby current.

BRIEF SUMMARY OF THE INVENTION

Embodiments of the present invention include a level-shifting circuit. The level-shifting circuit includes an output circuit including high-voltage devices configured for operation at voltages above a safe Vgs voltage of low-voltage devices. The output circuit includes a pull-up circuit coupled to a high-voltage source and configured for pulling up a voltage on an output signal in response to a high-side control signal. The output circuit further includes a pull-down circuit coupled in series between a low-voltage source and the pull-up circuit. The pull-down circuit is configured for pulling down the voltage on the output signal in response to a low-side control signal. The level-shifting circuit further includes a high-side inverting buffer operably coupled between an edge-controlled signal and the high-side control signal and comprising low-voltage devices configured to operate in a high-side low-voltage swing between the high-voltage source and a differential voltage less than the high-voltage source. The level-shifting circuit further includes a low-side buffer comprising low-voltage devices configured to operate in a low-side low-voltage swing between the low-voltage source and a differential voltage above the low-voltage source, and is further configured for driving the low-side control signal responsive to an input signal. The level-shifting circuit further includes an edge-control buffer operably coupled between the input signal and the high-side inverting buffer and configured to generate the edge-controlled signal with a slow rise time relative to a fall time of the edge-control buffer.

In another embodiment of the present invention, a method for shifting an input voltage level to a different output voltage level is included. The method comprises generating an edge-controlled signal with a slow rise time relative to a fall time of the edge-controlled signal. The method further includes generating a high-side control signal for controlling a pull-up device of an output circuit responsive to the edge-controlled signal, and operating with a high-side low-voltage swing between a high-voltage source and a differential voltage less than the high-voltage source. The method further includes generating a low-side control signal for controlling a pull-down device of the output circuit, wherein generating the low-side control signal is responsive to an inverted input signal. The method further includes toggling an output voltage level of an output voltage signal between a high-voltage level and a low-voltage level responsive to the high-side control signal and the low-side control signal.

Yet another embodiment of the present invention includes an integrated circuit including a plurality of semiconductor devices and a level-shifting circuit. The level-shifting circuit of the integrated circuit includes a current mirror comprising low-voltage devices configured to mirror a pull-up control current onto an edge-controlled signal. The level-shifting circuit further includes a control gate comprising a high-voltage device configured for operation at voltages above a safe Vgs voltage of the low-voltage devices. The control gate is operably coupled between the edge-controlled signal and a pull-down control current, and configured to pull-down the edge-controlled signal in response to an inverted input signal on the control gate. The level-shifting circuit further includes a high-side inverting buffer operably coupled between the edge-controlled signal and a high-side control signal and comprising low-voltage devices configured to operate in a high-side low-voltage swing between a high-voltage source and a differential voltage less than the high-voltage source. The level-shifting circuit further includes a low-side buffer comprising low-voltage devices configured to operate in a low-side low-voltage swing between a low-voltage source and a differential voltage above the low-voltage source. The low-side buffer is further configured for driving a low-side control signal responsive to the inverted input signal. The level-shifting circuit further includes an output circuit comprising high-voltage devices operably coupled to the high-side inverting buffer and the low-side buffer. The output circuit further comprises a PMOS transistor operably coupled to the high-voltage source and configured for pulling up a voltage on an output signal in response to the high-side control signal, and a NMOS transistor operably coupled in series between the low-voltage source and the PMOS transistor. The NMOS transistor is configured for pulling down the voltage on the output signal in response to the low-side control signal.

DETAILED DESCRIPTION

Embodiments of the present disclosure include apparatuses and methods for level-shifting. Although some examples used herein may describe level shifters implemented in TFT panels for LCDs, embodiments of the present disclosure should not be viewed as so limited. Rather, embodiments may be implemented as a driver of a load in many applications in which parameters such as high-voltage shifting, non-overlap timing, low shoot-through current, low standby current, or any combination thereof, may be desirable. Examples of such applications may include switching converters such as buck and boost converters, TFT level shifters, or other applications, which may require level-shifting from low-voltage digital control to high-voltage output signals.

Figure 2A:
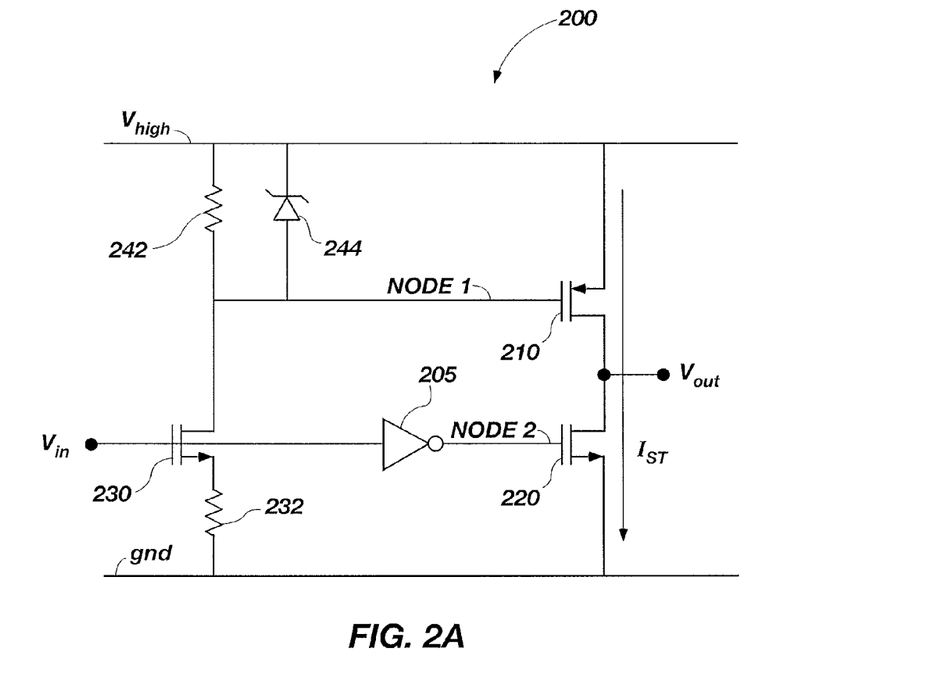
FIG. 2A illustrates a level shifter which may be used when the supply voltage exceeds the transistor maximum Vgs.

As previously discussed, level shifter 100 of FIG. 1 may not be suitable when the supply voltage exceeds the transistor maximum gate-to-source voltage. FIG. 2A illustrates a level shifter 200 which may be used when the supply voltage exceeds the transistor maximum Vgs. Level shifter 200 includes a PMOS transistor 210 and an NMOS transistor 220 operably coupled in series such that the drains of the two transistors are operably coupled. PMOS transistor 210 and NMOS transistor 220 may be referred to collectively herein as output transistors 210, 220. PMOS transistor 210 and NMOS transistor 220 may also be referred to as high-side and low-side transistors, respectively. The terms "output transistors," "high-side" and "low-side" transistors, may also be used for like numbers of other figures.

In level shifter 200, the source of the PMOS transistor 210 is operably coupled to the shift voltage $V_{high}$, and the source of the NMOS transistor 220 is operably coupled to ground. Resistor 242 and Zener diode 244 are operably coupled in parallel, and operably coupled between $V_{high}$ and the gate of PMOS transistor 210 to form NODE 1. The drain of NMOS transistor 230 is also operably coupled to NODE 1. As a result, NMOS transistor 230 controls PMOS transistor 210. Resistor 232 is operably coupled between the source of NMOS transistor 230 and ground. The input signal $V_{in}$ is operably coupled to the gate of NMOS transistor 230, and to an inverter 205 operably coupled to NMOS transistor 220. The node between the inverter 205 output and the gate of NMOS transistor 220 is NODE 2. The voltage at NODE 1 may be termed the gate control voltage of the PMOS transistor 210, and the voltage at NODE 2 may be termed the gate control voltage of the NMOS transistor 220.

In operation, $V_{in}$ toggles PMOS transistor 210 and NMOS transistor 220 on and off out-of-phase with each other. When $V_{in}$ is asserted, NMOS transistor 230 turns on, which turns on PMOS transistor 210. With $V_{in}$ asserted, the inverter 205 holds NMOS transistor 220 off. As a result, with PMOS transistor 210 turned on, and NMOS transistor 220 turned off, the output signal $V_{out}$ is $V_{high}$. In that scenario, level shifter 200 has successfully shifted a low-voltage input signal $V_{in}$ to a higher voltage (e.g., $V_{high}$) output signal $V_{out}$.

When $V_{in}$ is not asserted, NMOS transistor 230 is turned off. With NMOS transistor 230 off, resistor 242 pulls node 1 high, which turns off PMOS transistor 210. With $V_{in}$ not asserted, the inverter 205 turns on NMOS transistor 220, which pulls $V_{out}$ to ground. As a result, with PMOS transistor 210 turned off, and NMOS transistor 220 turned on, the output signal $V_{out}$ is 0V.

Zener diode 244 acts as a clamp to limit the voltage across resistor 242 in order to protect the gate oxide on PMOS transistor 210. Zener diode 244 may be configured to limit the voltage across resistor 242 to be less than or equal to the maximum Vgs of PMOS transistor 210. As a result, the configuration of level shifter 200 may be suitable for situations where $V_{high}$ is greater than the maximum Vgs of the transistors.

In order to ensure that PMOS transistor turns on completely, there may need to be more drive current through NMOS transistor 230 than there is through resistor 242. For example, if the circuit is designed to have a drive of 5 microamps and PMOS transistor has a Vgs of 5V, then to get 5V across resistor 242, the resistor 242 may need to be 5 Mohm, which may be too large for conventional IC processes. Additionally, with 5 microamps working against the gate charge of PMOS transistor 210, it may take as long as one millisecond to turn the gate of PMOS transistor 210 on and off. This may be unacceptable in some applications, and a larger current may be needed to turn the gate of PMOS transistor 210 on and off more quickly. All of these factors may result in a large operating current (standby current).

Additionally, having more drive current through NMOS transistor 230 than through resistor 242 may cause the voltage on NODE 1 to be faster to slew down than it does to slew up, which may, in turn, cause PMOS transistor 210 to be fast to turn on and slow to turn off in comparison to NMOS transistor 220 turning off and on, respectively. As will be more apparent in FIG. 2B, if PMOS transistor 210 turns on faster then NMOS transistor 220 turns off then a shoot-through path may exist from $V_{high}$ to ground with little resistance to limit the flow of shoot-through current $I_{ST}$. In the turn off case, PMOS transistor 210 is slow to turn off compared to turning on, and shoot-through current $I_{ST}$ may result in that case as well. The following example illustrates how shoot-through current $I_{ST}$ may be a problem in many applications for level shifter 200.

As an example, the current through resistor 242 may be limited to 1 mA. In order to make sure that PMOS transistor 210 has enough drive current over all process corners, temperature, etc., NMOS transistor 230 may need to be designed to have a 2 mA drive. This difference in drive current may cause PMOS transistor 210 to be fast to turn on and slow to turn off compared to the out-of-phase toggling of NMOS transistor 220. This overlap when PMOS transistor 210 and NMOS transistor 220 are both on may cause shoot-through current $I_{ST}$. In some circuits, which do not require a large drive current, it may be acceptable to ignore a small shoot-through current $I_{ST}$. However, it may not be acceptable to ignore shoot-through current $I_{ST}$ for switching converters requiring a large drive current (e.g., peak currents may be in the amp range rather than milliamps).

A complete example may further be given for a high-voltage application such as a level shifter for thin film transistor (TFT) panels. Resistor 242 (R1) and resistor 232 (R2) may be chosen such that the maximum Vgs of PMOS transistor 210 may not be exceeded, when:

$$Vgs \geq R1*(V_{in}-Vt_{230})/R2 \quad (1)$$

This arrangement may provide acceptable low performance operation, but generally may not be acceptable when either low propagation delay or fast slew rates are required with low power operation. Zener diode 244 may modify the circuit and improve performance by disrupting the equality of equation (1). With Zener diode 244, the ratio of resistor 232 and resistor 242 may be altered such that NODE 1 may aim for a much lower virtual final voltage when NMOS transistor 230 is turned on. This new operating condition may skew operation for PMOS transistor 210 to be fast to turn on and slow to turn off. High shoot-through current $I_{ST}$ may now be a problem through PMOS transistor 210 and NMOS transistor 220 during the transition from $V_{out}$ high to low (illustrated more clearly in FIG. 2B) when both output transistors 210, 220 are momentarily on. Shoot-through current may result in a damaged output signal or wasted power dissipation.

In the case of a TFT level shifter, the supply voltage $V_{high}$ may be 60V and the resistance of low and high-side switches might be 10 ohms each. The shoot-through current $I_{ST}$ may be calculated, $$I_{ST}=60V/20 \text{ ohms}=3 \text{ A} \quad (2)$$

The shoot-through current $I_{ST}$ may have a duration of 100 ns and be repeated at 100 kHz (common operating frequency of TFT level shifters). In that case, the average current ($I_{avg}$) for level shifter 200 may be, $$I_{avg}=3 \text{ A}*100 \text{ ns}*100 \text{ kHz}=3 \text{ mA} \quad (3)$$

This results in a average power dissipation ($P_{ST}$) from the shoot-through current ($I_{ST}$), $$P_{ST}=3 \text{ mA}*60V=180 \text{ mW} \quad (4)$$

Furthermore, TFT level shifters may be combined into groups such as, for example, 8, 12, or any number of level shifters. In such a group of TFT level shifters, over one watt of power might be lost due to the shoot-through current $I_{ST}$. Other circuits in which level shifter 200 may be implemented may result in more or less power dissipation.

Figure 2B:
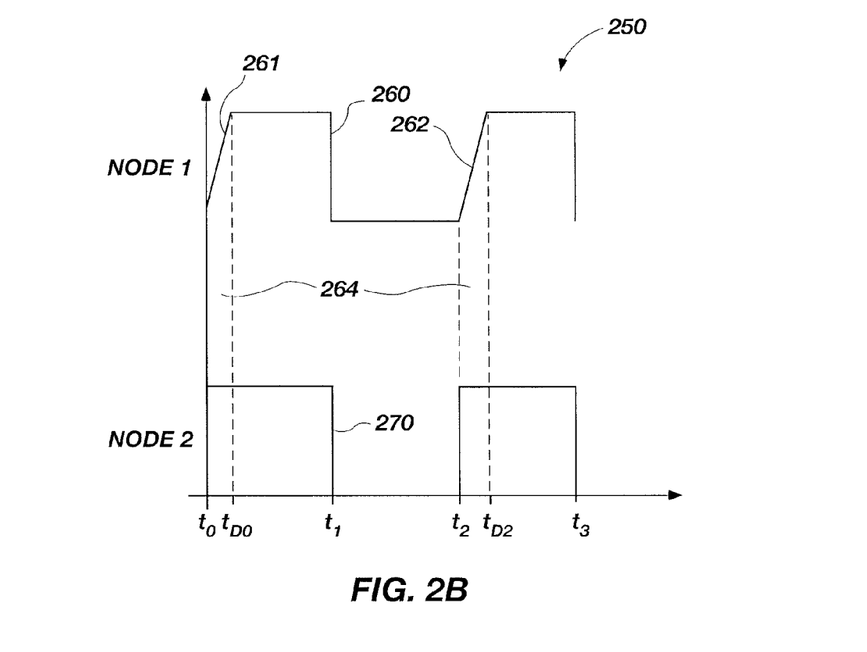
FIG. 2B shows a graph illustrating asymmetrical rise and fall times of the gate control voltages for output transistors of the level shifter shown in FIG. 2A.

FIG. 2B shows a graph 250 illustrating asymmetrical rise and fall times of the gate control voltages for output transistors of the level shifter 200 shown in FIG. 2A. The gate control voltages 260, 270 shown are for the PMOS transistor 210 (i.e., high-side) and NMOS transistor 220 (i.e., low-side), respectively. The voltage at NODE 1 is the gate control voltage 260 for the PMOS transistor 210. The voltage at NODE 2 is the gate control voltage 270 for the NMOS transistor 220. As previously described regarding FIG. 2A, an input signal $V_{in}$, toggles PMOS transistor 210 and NMOS transistor 220 on and off out-of-phase with each other. PMOS transistor 210 is off when the gate control voltage 260 at NODE 1 is asserted and on when the gate control voltage 260 at NODE 1 is not asserted. NMOS transistor 220 is on when the gate control voltage 270 at NODE 2 is asserted and off when the gate control voltage 270 at NODE 2 is not asserted.

As shown by FIG. 2B, transitions occur on $V_{in}$ at about $t_0$, $t_1$, $t_2$, and $t_3$. Because of the configuration of level shifter 200, transitions also occur on the gates of the output transistors 210, 220. Under ideal conditions, both gate control voltages 260, 270 at NODE 1 and NODE 2 would be asserted at the transitions at $t_0$ and $t_2$, which would cause PMOS transistor 210 to be off and NMOS transistor 220 to be on. However, for the reasons previously discussed, PMOS transistor 210 is slow to turn off, which is shown by rising edges 261, 262 of the control voltage 260. As a result, control voltage 260 at NODE 1 is actually asserted at $t_{D0}$ and $t_{D2}$, wherein the differences between $t_0$ and $t_{D0}$, and $t_2$ and $t_{D2}$ is some time overlap 264 that is required for the gate control voltage 260 to be fully asserted, which causes PMOS transistor 210 to turn off. During this time overlap 264, both PMOS transistor 210 and NMOS transistor 220 may be momentarily on, which may result in a very low resistance path from $V_{high}$ to ground in to create shoot-through current $I_{ST}$. Subsequently, IC designers may address the problem with shoot-through current $I_{ST}$ by adding turn-on delays to the paths of output transistors 210, 220, and thereby adding non-overlap timing.

Figure 3A:
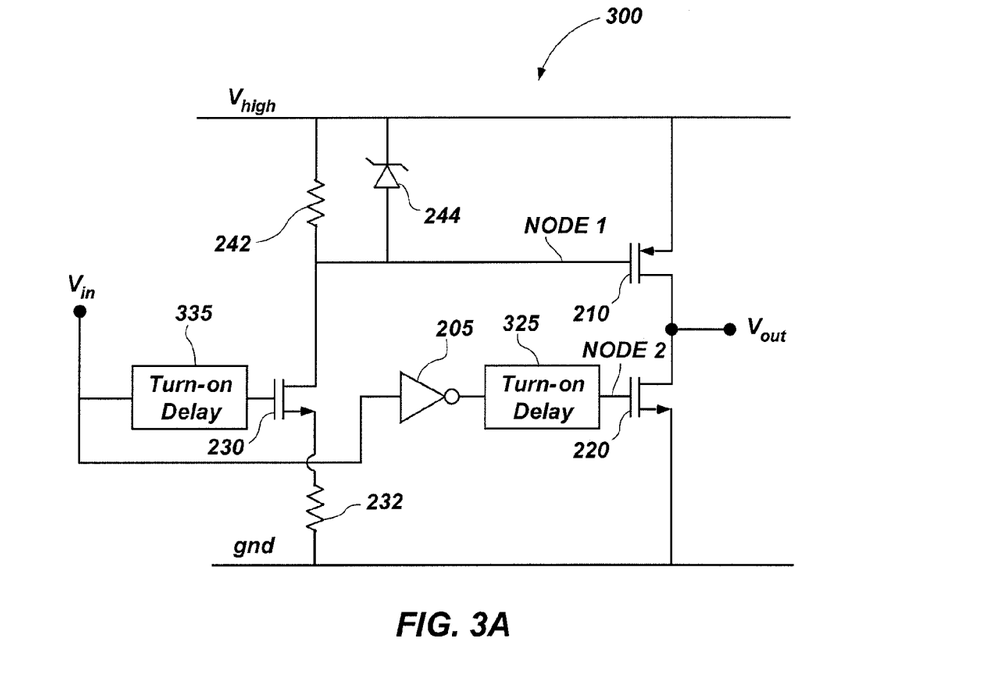
FIG. 3A illustrates a level shifter, including turn-on delays addressing some of the problems associated with the level shifter configuration of FIG. 2A.

FIG. 3A illustrates a level shifter 300 including turn-on delays 325, 335 addressing some of the problems associated with the level shifter 200 configuration of FIG. 2. The level shifter 300 is configured similarly as the level shifter 200 of FIG. 2, with common elements retaining the same numerical designation. The level shifter 300 further includes turn-on delays 325, 335. Turn-on delay 325 is operably coupled between the gate of NMOS transistor 220 and inverter 205, and turn-on delay 335 is operably coupled to the gate of NMOS transistor 230. Turn-on delays 325, 335 delay the signals to the gates of output transistors 210, 220 such that delay is added in turning on the output transistors 210, 220. Turn-on delays 325, 335 may be configured such that there may be no case where output transistors 210 and 220 are on at the same time. As a result, there may be no overlap, and no shoot-through current $I_{ST}$. This non-overlap timing is further illustrated in FIG. 3B.

Figure 3B:
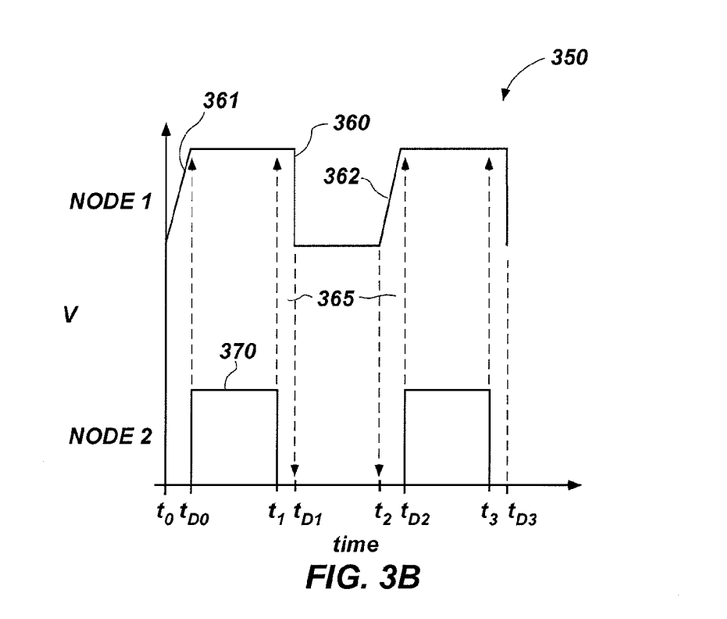
FIG. 3B shows a graph illustrating rise and fall times of the gate control voltages for output transistors of the level shifter shown in FIG. 3A.

FIG. 3B shows a graph 350 illustrating rise and fall times of the gate control voltages for output transistors 210, 220 of the level shifter 300 shown in FIG. 3A including non-overlap timing 365. The gate control voltages 360, 370 shown are for the PMOS transistor 210 and NMOS transistor 220, respectively. The voltage at NODE 1 is the gate control 360 voltage of PMOS transistor 210. The voltage at NODE 2 is the gate control voltage 370 of NMOS transistor 220. An input signal $V_{in}$ toggles PMOS transistor 210 and NMOS transistor 220 on and off out-of-phase with each other. PMOS transistor 210 is off when the gate control voltage 360 at NODE 1 is asserted, and on when the gate control voltage 360 at NODE 1 is not asserted. NMOS transistor 220 is on when the gate control voltage 370 at NODE 2 is asserted and is off when the gate control voltage 370 at NODE 2 is not asserted.

As shown in FIG. 3B, transitions occur on $V_{in}$ at about $t_0$, $t_1$, $t_2$, and $t_3$. However, because of the different configurations of level shifter 300, the transitions at the gates of level shifter 300 may not occur at the same times as transitions on $V_{in}$. For the reasons previously discussed, PMOS transistor 210 is slow to turn off, which is shown by the rising edges 361, 362 of the gate control voltage 360. However, because level shifter 300 includes turn-on delays 325, 335, transitions at the gates to turn on output transistors 210, 220 may occur at delayed times $t_{D0}$, $t_{D1}$, $t_{D2}$, $t_{D3}$. In other words, turn-on delay 325 may cause delays of the gate control signal 370 on NODE 2 such that NMOS transistor 220 turns on at $t_{D0}$ and $t_{D2}$. Turn-on delay 335 may cause delays of the gate control voltage 360 on NODE 1 such that PMOS transistor 210 turns on at $t_{D1}$ and $t_{D2}$. Thus, the turn-on delays 325, 335 may be configured such that PMOS transistor 210 and NMOS transistor 220 are not on at the same time, which eliminates shoot-through current $I_{ST}$.

One problem with level shifter 300 may result from attempts to build ample margin into the turn-on delays so that they work across process corners, temperature, and supply operating ranges. Although power dissipation may be improved and fast output slew rates may be possible, propagation delay from the slow turn off of PMOS transistor 210 may be increased. The increase in propagation delay may be a minimal problem because the turn-on delays can be balanced resulting in symmetrical on and off propagation delays that can be offset elsewhere in the system, however, circuit complexity and, therefore, layout footprint may still be increased. Additionally, as with level shifter 200 of FIG. 2A, standby current still depends on the input/output state as PMOS transistor 210 may have a high gate capacitance requiring high-drive current from NMOS transistor 230 and resistor 242.

Figure 4:
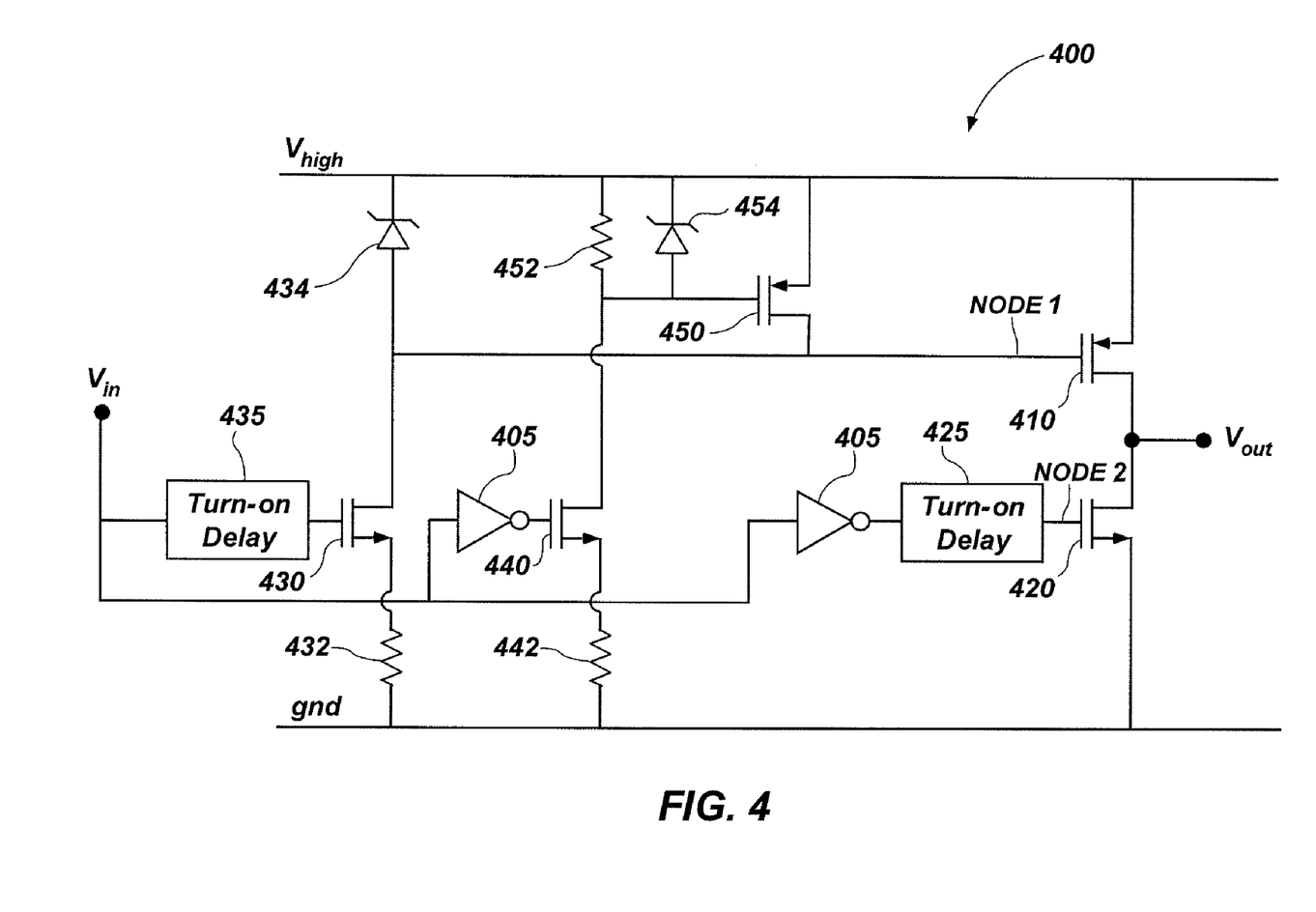
FIG. 4 illustrates a level shifter used in high-voltage integrated circuits with an active device to turn off the high-side transistor.

FIG. 4 illustrates a level shifter 400 used in high-voltage integrated circuits with an active device to turn off the high-side PMOS transistor 410. Level shifter 400 includes output transistors 410, 420 configured as before to toggle on and off out-of-phase with each other depending on the input signal $V_{in}$. As with level shifter 300 of FIG. 3, level shifter 400 of FIG. 4 includes turn-on delays 425, 435 operably coupled to the gates of NMOS transistors 420 and 430, respectively. NMOS transistor 430 is operably coupled to NODE 1, which is the control gate to PMOS transistor 410. NMOS transistor is also coupled to resistor 432, which is coupled to gnd. PMOS transistor 450 is operably coupled between $V_{high}$ and NODE 1 in order to actively turn off PMOS transistor 410. NMOS transistor 440 is operably coupled in series with resistor 442 between the gate of PMOS transistor 450 and ground, with the gate of NMOS transistor 440 operably coupled to an inverted $V_{in}$ Zener diode 434 is operably coupled between $V_{high}$ and NODE 1. Zener diode 434 may be configured to limit the Vgs of PMOS transistor 410 to be less than the maximum Vgs of PMOS transistor 410. Similarly, the parallel combination of resistor 452 and Zener diode 454 between $V_{high}$ and the gate of PMOS transistor 450 may be configured to limit the Vgs of PMOS transistor 450 to be less than the maximum Vgs of PMOS transistor 450.

In operation, when $V_{in}$ is asserted, NMOS transistor 430 turns on, which also turns on PMOS transistor 410. With $V_{in}$ asserted, both NMOS transistors 420 and 440 are held off. With PMOS transistor 410 turned on, and NMOS transistor 420 turned off, the output signal $V_{out}$ is equal to $V_{high}$. When $V_{in}$ is not asserted, NMOS transistor 430 turns off, which allows NODE 1 to be pulled high. Because of inverters 405, when $V_{in}$ is not asserted both NMOS transistor 420 and NMOS transistor 440 are turned on. With NMOS transistor 440 turned on, PMOS transistor 450 is also turned on pulling the gate control voltage on NODE 1 to $V_{high}$. As a result, the combination of NMOS transistor 440 and PMOS transistor 450 actively turns off PMOS transistor 410 when $V_{in}$ toggles low. When $V_{in}$ is not asserted, NMOS transistor 420 is on. With PMOS transistor 410 off and NMOS transistor 420 on, $V_{out}$ is pulled to ground.

Although the active shut off function of PMOS transistor 450 along with turn-on delays 425, 435 may eliminate shoot-through current, significant circuitry may be involved that adds to the silicon area needed in the construction of level shifter 400. Additionally, PMOS transistor 410 may have with a large gate capacitance. In order to actively turn off PMOS transistor 410, PMOS transistor 450 may need to be large. While level shifter 400 may be an improvement on previous level shifters, level shifter 400 may still have deficiencies in that a significant margin may still be required to be built into the turn on delays 425, 435 because of the general construction of PMOS transistor 410 being slow to turn off and fast to turn on. While PMOS transistor 450 may be used to actively turn off PMOS transistor 410, a significant amount of non-overlap timing in the turn on delays 425, 435 may be needed to cover for process corners, temperature operating range, and supply operating ranges when designing for the worst case scenarios. Furthermore, the additional circuitry may increase the complexity and silicon area needed to implement level shifter 400.

Figure 5:
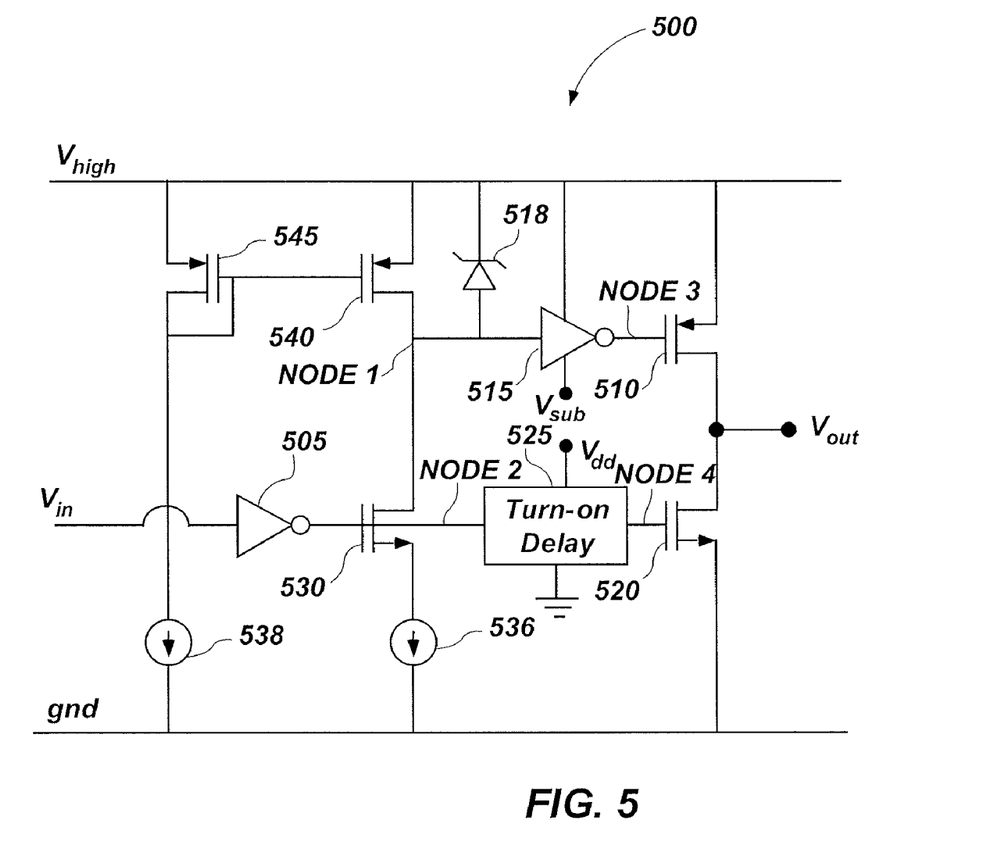
FIG. 5 illustrates a level shifter according to an embodiment of the present invention.

FIG. 5 illustrates a level shifter 500 according to an embodiment of the present invention. Level shifter 500 may include an output circuit comprising high-voltage devices configured for operation at voltages above a safe Vgs voltage of low-voltage devices. As shown in FIG. 5, in level shifter 500, output circuit may include a pull-up circuit (e.g., PMOS transistor 510), and a pull-down circuit (e.g., NMOS transistor 520). The pull-up circuit may be configured for pulling up a voltage on an output signal $V_{out}$ in response to a high-side control signal (e.g., input at the gate of PMOS transistor 510 is negated). The pull-down circuit may be configured for pulling down the voltage on the output signal $V_{out}$ in response to a low-side control signal (e.g., input at the gate of NMOS transistor 520 is asserted).

Level shifter 500 may further include a high-side inverting buffer (e.g., driver 515) operably coupled between an edge-controlled signal (e.g., input to driver 515) and the high-side control signal (e.g., input at the gate of PMOS transistor 510). The high-side inverting buffer (e.g., driver 515) may include low-voltage devices configured to operate in a high-side low-voltage swing between $V_{high}$ and a differential voltage $V_{sub}$ less than the $V_{high}$. Differential voltage $V_{sub}$ may be some voltage difference lower than $V_{high}$ in that the difference between $V_{high}$ differential voltage $\T_{sub}$ may be some low-voltage logic signal such as, for example, 1.8V, 2.5V, 3.3V depending on the logic of the low-voltage devices. Differential voltage $V_{sub}$ may be generated by a voltage reference circuit as known in the art.

Level shifter 500 may further include a low-side buffer (e.g., turn on delay 525) comprising low-voltage devices configured to operate in a low-side low-voltage swing between the low-voltage source (e.g., ground) and a differential voltage $V_{dd}$ above the low-voltage source. Low-side buffer (e.g., turn on delay 525) may be further configured for driving the low-side control signal (e.g., input at the gate of NMOS transistor 520) responsive to an input signal (e.g., inverted $V_{in}$).

Level shifter 500 may further include an edge-control buffer operably coupled between the input signal (e.g., inverted $V_{in}$) and the high-side inverting buffer (e.g., driver 515) and configured to generate the edge-controlled signal (e.g., input to driver 515) with a slow rise time relative to a fall time of the edge-control signal (e.g., input to driver 515). Edge control buffer may include PMOS transistors 540, 545, pull-down control current 536, pull-up control current 538, and a control gate (e.g., NMOS transistor 530).

As shown in FIG. 5, PMOS transistor 510 and NMOS transistor 520 may be operably coupled in series such that the drains of the two transistors are operably coupled to each other. The source of PMOS transistor 510 is operably coupled to a supply voltage $V_{high}$. The source of NMOS transistor 520 is operably coupled to ground. Level shifter 500 includes NMOS transistor 530 configured to control the gate of PMOS transistor 510 through driver 515. Level shifter 500 further includes turn on delay 525 operably coupled to the gate of NMOS transistor 520.

Pull-down control current 536 and pull-up control current 538 may be operably coupled to NMOS transistor 530, and PMOS transistor 545, respectively. Pull-down control current 536 and pull-up control current 538 may be referred to collectively as control currents 536, 538. Control currents 536, 538 may be generated by circuitry configured to obtain a desired operating current (standby current) for the level shifter 500. As non-limiting examples, control currents 536 and 538 may be generated by current references, such as from high-voltage devices. As PMOS transistor 545 may be a low-voltage device, pull-up current 538 may be constructed from high-voltage devices. Pull-down current may comprise low-voltage devices or high-voltage devices, or may be a slave current from a current mirror (not shown). The values and ratios for control currents 536, 538 may further affect performance of level shifter 500, as will be discussed below.

Zener diode 518 may be a low-voltage device that acts as a clamp to limit the voltage in order to protect the gate oxide on transistors within driver 515. Zener diode 518 may be configured to limit the voltage to be less than or equal to the maximum Vgs of transistors within driver 515. PMOS transistors 540, 545 may be configured as a current mirror-to-mirror pull-up control current 538 onto NODE 1 when NMOS transistor 530 is turned on. It should be noted that NODE 1 in this example is the input to driver 515, rather than the gate control for PMOS transistor 510.

In operation, $V_{in}$ indirectly toggles PMOS transistor 510 and NMOS transistor 520 on and off out-of-phase with each other. Because of inverter 505 being operably coupled to the gate of NMOS transistor 530, when $V_{in}$ is asserted NMOS transistor 530 turns off and NODE 1 is pulled high by mirror PMOS transistor 540 and its associated control current 538, which is mirrored onto NODE 1.

Driver 515, therefore, drives a low on the gate of PMOS transistor 510 to turn on PMOS transistor 510. Thus, as with previous examples, when $V_{in}$ is asserted, PMOS transistor 510 is on. When $V_{in}$ is asserted, the inverter 505 turns NMOS transistor 520 off a turn-on delay later. With PMOS transistor 510 turned on, and NMOS transistor 520 turned off, the output signal $V_{out}$ is $V_{high}$. In that scenario, level shifter 500 has successfully shifted a low-voltage input signal $V_{in}$ to a higher voltage (e.g., $V_{high}$) output signal $V_{out}$.

When $V_{in}$ is not asserted, NMOS transistor 530 is turned on, because of inverter 505, and pulls NODE 1 low. Driver 515 inverts NODE 1 to put a high on the gate of PMOS transistor 510 and turn off PMOS transistor 510. When $V_{in}$ is negated, the inverter 505 turns on NMOS transistor 520 a turn-on delay later, which pulls $V_{out}$ to ground. As a result, with PMOS transistor 510 turned off, and NMOS transistor 520 turned on, the output signal $V_{out}$ is 0V.

Driver 515 may be configured to control the PMOS transistor 510 to turn off quickly and turn on slowly. An example for driver 515 may be an inverter, such as a CMOS inverter. Such an inversion may take advantage of the asymmetrical condition of the output transistors 510, 520 in conjunction with asymmetrical control currents 536, 538. Previous level shifters were slow to turn off and fast to turn on, which often resulted in shoot-through current if low-voltage turn on delays were not implemented for the high-side PMOS transistor.

PMOS transistor 540 may be configured to provide passive pull-up on NODE 1 by sourcing a small continuous current (e.g., pull-up control current 538). Because the pull-up control current 538 may be small, the pull-up may be relatively slow as the pull-up control current 538 is integrated into the parasitic capacitance on NODE 1. Pull-down control current 536 may be configured to skew the symmetry on NODE 1. Pull-down control current 536 may be larger than pull-up control current 538 in order to increase the pull-down time on NODE 1, which, in conjunction with driver 515 now controls PMOS transistor 510 to be fast to turn off and to turn on at a slower rate. In previous designs, the delay on the high-voltage devices (e.g., PMOS transistor 210 of FIG. 3A) are being controlled by parasitic capacitance from the low-voltage devices (e.g., turn-on delay 335 of FIG. 3A). With level shifter 500, the turn on and the turn off of PMOS transistor 510 may be a function of just the parasitic capacitance from the NMOS transistor 530, which is a high-voltage device. Other components coupled to the input of driver 515 on NODE 1 (e.g., Zener diode 518, PMOS transistor 540, and driver 515) may be configured as low-voltage devices that contribute less to the parasitic capacitance on NODE 1. Having the parasitic capacitance result substantially from a high-voltage device such as NMOS transistor 530 may permit the drive current to overcome the parasitic capacitance on NODE 1. In that case, pull-down control current 536 may be small (e.g., in the microamp range that may significantly reduce standby current). If other components on NODE 1 were high-voltage devices, then the added parasitic capacitance on NODE 1 may require a larger drive current to overcome the parasitic capacitance. Additionally, because pull-down control current 536 is greater than pull-up current 538 at a fixed rate, the edge-controlled signal (e.g., input to driver 515) may remain substantially in the same relationship, even if the parasitic capacitance on NODE 1 changes with temperature or process changes.

Because NMOS transistor 530 and PMOS transistor 540 drive the input to driver 515 (which may include minimum geometry low-voltage transistors), there may be little charge or drive required on NODE 1 compared to other level shifters where large drive was required to drive the high-voltage output transistor. As a result, even less standby current may be needed to operate level shifter 500, including standby currents in the order of microamps.

As discussed, driver 515 may be configured as an inverter. Alternatively, driver 515 may comprise a multi-stage inverter wherein an inverter may be followed by larger inverter stages to increase both signal gain and drive capability. A fast-gate control voltage at high-side PMOS transistor 510 may further reduce power dissipation by minimizing the output slew rate, which may reduce the amount of time that PMOS transistor 510 experiences both a drain to source voltage and drain current resulting in excess power dissipation.

Level shifter 500 may overcome limitations of the level shifters shown in FIGS. 1-4 while preserving some of the benefits of each. For example, a significant disadvantage of the level shifter 200 shown in FIG. 2 may be turned into an advantage in level shifter 500 shown in FIG. 5. In FIG. 2, the resistors could be chosen so that the high-side transistor turned on quickly but was slow to turn off. This asymmetry resulted in undesirable shoot-through current $I_{ST}$. With level shifter 500, the NODE 1 gate control signal is inverted by driver 515 such that high-side PMOS transistor is 510 is fast to turn off and slow to turn on due the asymmetry in control currents 536 and 538.

The slow-to-turn-on case may be used to generate the non-overlap timing shown in FIGS. 3 and 4. However, with level shifter 500, NMOS transistor 530 no longer drives the large gate capacitance of high-side PMOS transistor 510 but may now operate to drain charge from small devices such as PMOS transistor 545, Zener diode 518, and the input of driver 515. In other words, NMOS transistor 530 may only toggle a small current to control high-side PMOS transistor 510, which may result in a reduced power dissipation and reduced size of the circuit implementation when compared to current practice.

Control currents 536 and 538 may be adjusted to improve propagation delay and slew rate while maintaining superior performance compared with level shifters shown in FIGS. 1-4. For example, control currents 536 and 538 may be set in a 2:1 ratio (e.g., 2 uA:1 uA); however, other ratios may be possible (e.g., 5 uA:1 uA). As a result, level shifter 500 may be more efficient and may include built-in non-overlap timing, which may reduce adverse tradeoffs from previous level shifters while enabling fast output slew rate and minimal standby current from an architecture that turns inherent delay into desirable non-overlap timing.

Figure 6:
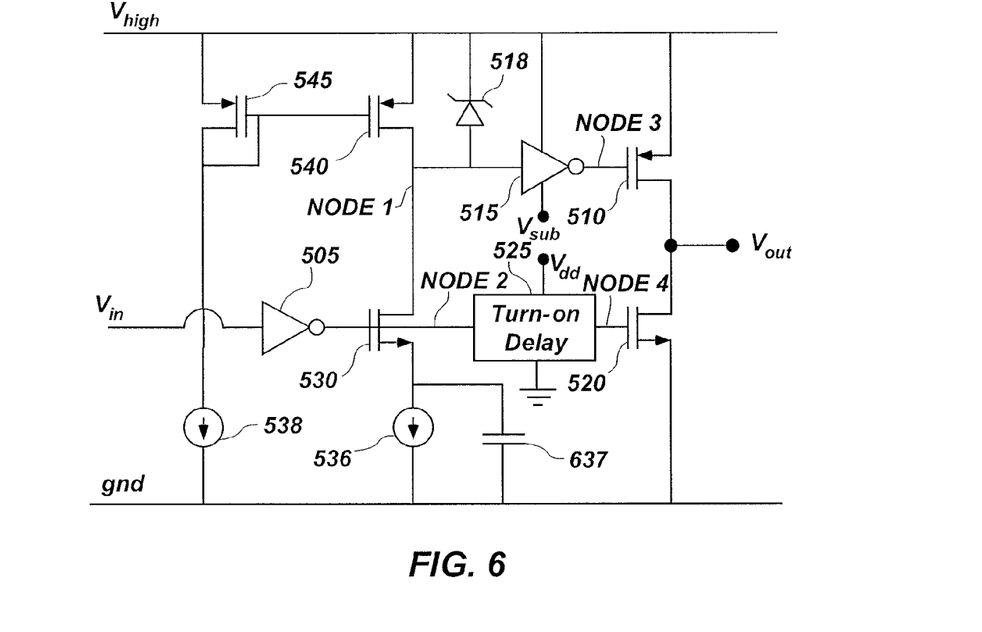
FIG. 6 illustrates a level shifter including a speed-up capacitor according to an embodiment of the present invention.

FIG. 6 illustrates a level shifter 600 including a speed-up capacitor according to an embodiment of the present invention. Level shifter 600 may be configured as shown in FIG. 5, with the addition of a speed-up capacitor 637 operably coupled to the source of NMOS transistor 530, such that speed-up capacitor is in parallel with control current 536.

In operation, the current required to move NODE 1 down may only be required during transitions of the output transistors 510, 520. When $V_{in}$ has been asserted for an extended period of time, NMOS transistor 530 may also have been turned off for an extended period of time. In that case, control current 536 may flow into speed-up capacitor 637, which eventually pulls the voltage across speed-up capacitor to 637 to ground through discharge of speed-up capacitor 637.

When $V_{in}$ is not asserted, the gate of NMOS transistor 530 is pulled high turning on NMOS transistor 530. Because speed-up capacitor 637 may not change instantaneously, the voltage at the source of NMOS transistor 530 is momentarily held low (e.g., ground), which causes NMOS transistor 530 to enter its maximum on condition to source as much current. The amount of current sourced by NMOS transistor 530 may be related to a ratio of the capacitance of the speed-up capacitor 637 and the parasitic capacitance of NODE 1. For example, if the capacitance of the speed-up capacitor 637 is 10 times bigger than the parasitic capacitance of NODE 1, the momentary current sourced by NMOS transistor 530 may also be approximately 10 times more than is normally required to move NODE 1.

As a result of the foregoing, speed-up capacitor 637 may improve standby current when NMOS transistor 530 is off and may provide a large peak current to remove the charge of NODE 1 during transitions of $V_{in}$ asserted to $V_{in}$ not asserted. Additionally, speed-up capacitor 637 may speed-up the NODE 1 fall time, further skewing the high-side PMOS transistor 510 to turn off fast and turn on slow. Because NODE 1 may not have much parasitic capacitance, the capacitance of speed-up capacitor 637 may also not need to be large. For example, 1 pF capacitance for speed-up capacitor 637 may increase the peak current on NODE 1 by approximately 50 times, and may not significantly add to silicon area. Other smaller capacitors for speed-up capacitor 637 may be used depending on the requirements of the level shifter.

Figure 7:
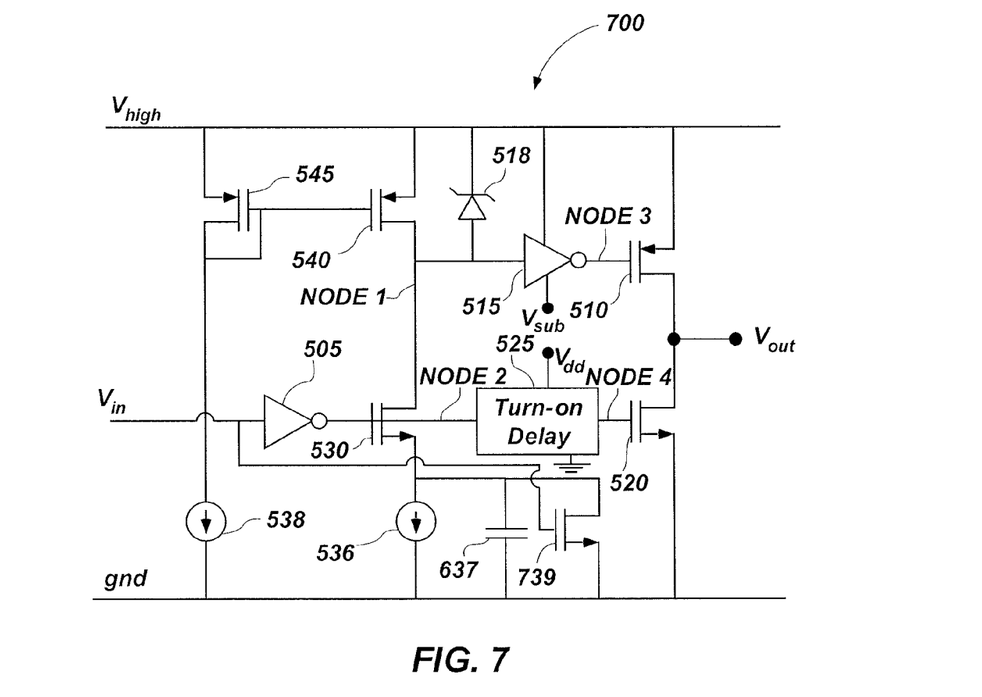
FIG. 7 illustrates a level shifter with a speed-up capacitor and a discharge device according to an embodiment of the present invention.

FIG. 7 illustrates a level shifter 700 with a speed-up capacitor and a discharge device according to an embodiment of the present invention. Level shifter 700 may be configured as shown in FIG. 6, with the addition of a discharge device 739 operably coupled to the speed-up capacitor 637. Discharge device 739 may be configured to discharge the speed-up capacitor 637 at non-transition times in order to reduce standby current and speed-up the NODE 1 fall time. In operation, whenever $V_{in}$ is asserted and turns off NMOS transistor 530, discharge device 739 actively discharges speed-up capacitor 637 rather than relying on pull-down control current 536. As shown in FIG. 7, discharge device 739 may comprise an NMOS transistor with the source operably coupled to the speed-up capacitor 637, the drain operably coupled to wound, and the gate operably coupled to $V_{in}$.

Figure 8A:
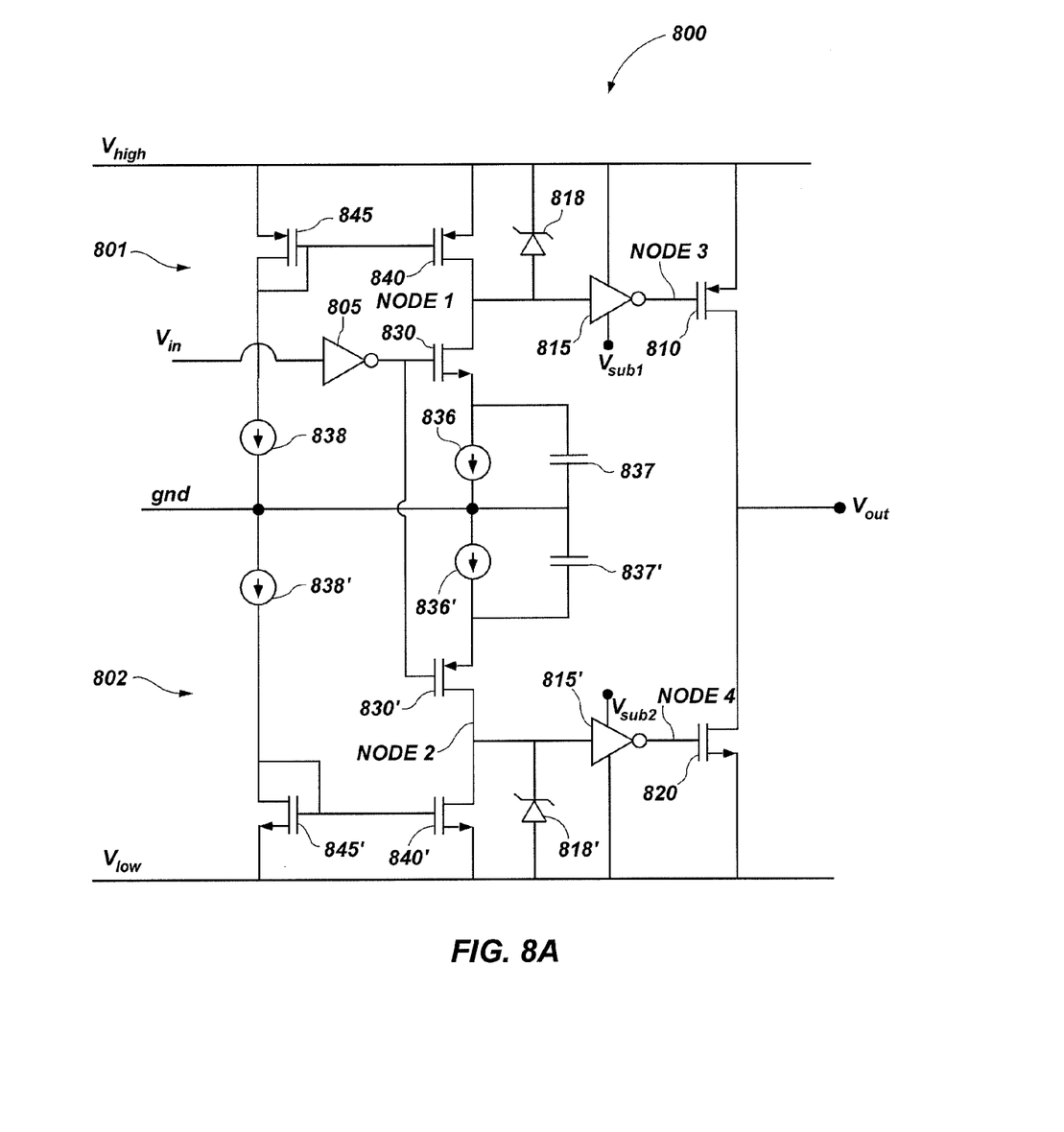
FIG. 8A illustrates a level shifter with low- to high-voltage swings according to an embodiment of the present invention.

FIG. 8A illustrates a level shifter 800 with low- to high-voltage swings according to an embodiment of the present invention. Level shifter 800 includes output transistors 810, 820 operably coupled in series in which the drains of the output transistors 810, 820 are operably coupled. An output signal $V_{out}$ is defined at the node of the drains of the output transistors. The source of PMOS transistor 810 is operably coupled to an upper supply voltage ($V_{high}$). The source of the NMOS transistor 820 is operably coupled to a lower supply voltage ($V_{low}$). The gate of PMOS transistor 810 is operably coupled to upper circuitry 801. The gate of NMOS transistor 820 is operably coupled to lower circuitry 802. Level shifter 800 may be constructed by having a symmetrical circuit that is folded over. In other words, upper circuitry 801 and lower circuitry 802 may include similar components, which perform similar functions. As such, focus will be given mostly to upper circuitry 801. Similar components of the lower circuitry 802 have the same numerical designation with a prime character (').

Level shifter 800 includes NMOS transistor 830 configured to receive input signal $V_{in}$ through drive 805 and control the gate of PMOS transistor 810 through driver 815. Pull-down control current 836 and pull-up control current 838 may be operably coupled to NMOS transistor 830 and PMOS transistor 845, respectively. Pull-down control current 836 and pull-up control current 838 may be referred to collectively as control currents 836, 838. Control currents 836, 838 may be generated by circuitry configured to obtain a desired operating current (standby current) for the level shifter 800. The values and ratios for control currents 836, 838 may further affect performance of level shifter 800. Zener diode 818 acts as a clamp to limit the voltage in order to protect the gate oxide on transistors within driver 815. PMOS transistors 840, 845 may be configured as a current mirror-to-mirror control current 838 onto NODE 1. As with FIGS. 5-7, NODE 1 in this example defined as the input to driver 815, rather than the gate control for PMOS transistor 810. NODE 3 is defined as the gate control for the PMOS transistor 810.

Driver 815 may be configured to control the PMOS transistor 810 to turn off quickly and turn on slowly. An example for driver 815 may be an inverter, such as a CMOS inverter, or a multi-stage inverter. Such an inversion may take advantage of the asymmetrical condition of the output transistors 810, 820 in conjunction with asymmetrical control currents 836, 838.

PMOS transistor 840 may be configured to provide passive pull-up on NODE 1 by sourcing a small continuous current. Because the pull-up control current 838 may be small, the pull-up may be relatively slow as the pull-up control current 838 is integrated into the parasitic capacitance on NODE 1. Pull-down control current 836 may be configured to skew the symmetry on NODE 1. Pull-down control current 836 may be larger than pull-up control current 838 in order to increase the pull-down time on NODE 1, which in conjunction with driver 815, now controls PMOS transistor 810 to be fast to turn off and to turn on at a slower rate. Due to the low-drive currents required by driver 815, control currents may be small relative to other level shifters, which also results in level shifter 800 having a low standby current.

Speed-up capacitor 837 may be operably coupled parallel with pull-down control current 836 and configured as before to speed-up the NODE 1 fall time, further skewing the high-side PMOS transistor 810 to turn off fast, turn on slow, and to further reduce the standby current in level shifter 800. As previously discussed with FIG. 6, speed-up capacitor 837 may have to be sufficiently large to overcome parasitic capacitance on NODE 1, which reduces the dependence on control currents 836 and 838.

Lower circuitry 802 may perform similar functions as upper circuitry 801, but for the pull-down side rather than the pull-up side. For that reason, specific configurations of the specific components of lower circuitry 802 are not discussed in detail. However, it should be noted that transistors in the upper circuitry 801 may be NMOS transistors when the corresponding transistor in the lower circuitry 802 may be PMOS transistors and vice versa. For example, NMOS transistor 830 and PMOS transistor 830' may correspond to similar functions (e.g., to control the gates of output transistors 810, 820, respectively), yet the components are not completely identical. These differences are to allow for $V_{in}$ to indirectly toggle PMOS transistor 810 and NMOS transistor 820 on and off out-of-phase with each other. When $V_{in}$ is asserted, the PMOS transistor 810 is on and NMOS transistor 820 is off. With PMOS transistor 810 on and NMOS transistor 820 off, the voltage on output signal $V_{out}$ is pulled to $V_{high}$. It should also be noted that NODE 3 and NODE 4 are defined as the gate control nodes of the gates to the corresponding output transistors 810, 820. These nodes will be discussed along with FIG. 8B.

While other embodiments of the present invention permitted voltages on $V_{out}$ to be from 0V to $V_{high}$, level shifter 800 may permit voltages on $V_{out}$ to range from $V_{low}$ to $V_{high}$. Additional range for $V_{out}$ may be useful for circuits where negative to positive voltage swings may be needed to drive a signal on $V_{out}$. An example of such an implementation may include a TFT shifter, which may need to drive TFT panels requiring an operating range switching between a low voltage and a high voltage, such as, a negative and a positive voltage (e.g., −20V to 40V).

Figure 8B:
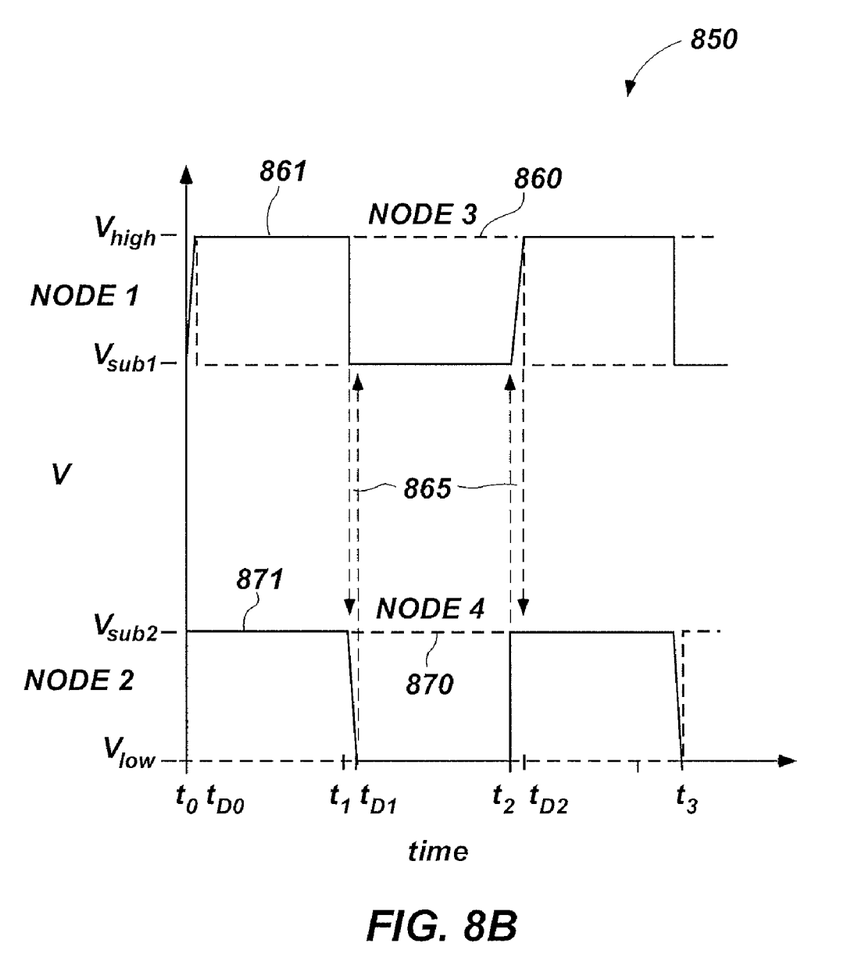
FIG. 8B shows a graph illustrating rise and fall times of the driver inputs, and the gate control voltages for output transistors of the level shifter shown in FIG. 8A including built-in non-overlap timing, resulting in reduced shoot-through current.

FIG. 8B shows a graph 850 illustrating rise and fall times of the driver inputs, and the gate control voltages for output transistors 810, 820 of the level shifter 800 shown in FIG. 8A, including built-in non-overlap timing resulting in reduced shoot-through current.

Driver input voltages 861, 871 (represented by solid lines) shown are for the inputs to the drivers corresponding to the gates of output transistors 810, 820, respectively. The voltage at NODE 1 is the driver input voltage 861 for driver 815. The voltage at NODE 2 is the driver input voltage 871 for driver 815'. The gate control voltages 860, 870 (represented by dashed lines) shown are for the PMOS transistor 810 and NMOS transistor 820, respectively. The voltage at NODE 3 is the gate control 860 voltage of PMOS transistor 810. The voltage at NODE 4 is the gate control voltage 870 of NMOS transistor 820. An input signal $V_{in}$ indirectly toggles PMOS transistor 810 and NMOS transistor 820 on and off out-of-phase with each other. PMOS transistor 810 is off when the gate control voltage 860 at NODE 3 is asserted and on when the gate control voltage 860 at NODE 3 is not asserted. NMOS transistor 820 is on when the gate control voltage 870 at NODE 4 is asserted and off when the gate control voltage 870 at NODE 4 is not asserted. As previously discussed, drivers 815, 815' may be configured to cause output transistors 810, 820 to turn off quickly and turn on slowly. Drivers 815, 815' may be inverters or multiple stage inverters. As such, gate control voltages 860, 870 may be inverted signals of driver input voltages 861, 871. Examples of $V_{high}$ and $V_{low}$ may be 30V and 30V respectively 30V, respectively, to give a large voltage swing (e.g., 50V) on the output signal $V_{out}$, which may be desirable for high-voltage loads such as TFT panels. Examples of differential voltages $V_{sub1}$ and $V_{sub2}$ may be 26.7V and −26.7V, respectively, which may be differential voltages to create a high-side and low-side low-voltage swing between $V_{high}$ and $V_{sub1}$, and $V_{low}$ and $V_{sub2}$, according to the low-voltage devices of the high-side and low-side buffers.

As shown in FIG. 8B, transitions occur on $V_{in}$ at about $t_0$, $t_1$, $t_2$, and $t_3$. However, because of the different configurations of level shifter 800, the transitions at the gates of level shifter 800 may not occur at the exact same times as transitions on $V_{in}$. Because drivers 815, 815' and other circuitry have been configured to cause output transistors to turn off quickly, and turn on slowly, transitions at the gates to turn on output transistors 810, 820 may occur about at delayed times $t_{DO}$, $t_{D1}$, $t_{D2}$, $t_{D3}$. In other words, NMOS transistor 820 may turn on at about $t_{D1}$ and $t_{D3}$. PMOS transistor 810 may turn on at about $t_{DO}$ and $t_{D2}$. Non-overlap timing 865 may exist, and PMOS transistor 810 and NMOS transistor 820 may not be on at the same time, which may eliminate shoot-through current $I_{ST}$. This non-overlap timing 865 occurs naturally within the operation of the output transistors 810, 820, rather than through turn on delays as in other conventional level shifters. Causing the output transistors 810, 820 to turn off quickly and turn on slowly, rather than the other way around, may allow non-overlap timing 865 to adjust better through process corners, temperature, and supply operating ranges, such that propagation delay may be improved as well.

Level shifters are common in high-voltage circuit design. Often, the designer trades off power dissipation, implementation size, propagation delay, and/or slew rate to improve the level shifter for a particular application. Embodiments of the present invention have been described which may achieve improved performance across each of those requirements to produce an efficient high-voltage, low standby current, level shifter which reduces shoot-through current. These parameters may result from built-in non-overlap timing.

While the present invention has been described herein with respect to certain preferred embodiments, those of ordinary skill in the art will recognize and appreciate that it is not so limited. Rather, many additions, deletions, and modifications to the preferred embodiments may be made without departing from the scope of the invention as hereinafter claimed. In addition, features from one embodiment may be combined with features of another embodiment while still being encompassed within the scope of the invention as contemplated by the inventor.

What is claimed is:

1. A level-shifting circuit, comprising:
   an output circuit comprising:
      a pull-up circuit coupled to a high-voltage source and configured for pulling up a voltage on an output signal in response to a high-side control signal; and
      a pull-down circuit coupled in series between a low-voltage source and the pull-up circuit, wherein the pull-down circuit is configured for pulling down the voltage on the output signal in response to a low-side control signal;
   a high-side inverting buffer operably coupled to the output circuit and configured to drive the high-side control signal responsive to an edge-controlled signal;
   a low-side buffer configured to drive the low-side control signal responsive to an input signal; and
   an edge-control buffer including a current minor operably coupled to the high-side inverting buffer, wherein the current mirror is configured to mirror a pull-up control current from one side of the current mirror into the edge-controlled signal, wherein the edge-controlled signal exhibits a slow rise time relative to a fall time of the edge-control signal.

2. The level-shifting circuit of claim 1, wherein the edge-control buffer is further configured to generate the edge-controlled signal to rise slowly relative to a rise time of the input signal to the low-side buffer.

3. The level-shifting circuit of claim 1, wherein the pull-up circuit comprises a PMOS transistor, and the pull-down circuit comprises an NMOS transistor, wherein:
   a drain of the PMOS transistor is operably coupled to a drain of the NMOS transistor;
   a source of the PMOS transistor is operably coupled to the high-voltage source;
   a source of the NMOS transistor is operably coupled to the low-voltage source;
   a gate of the PMOS transistor is operably coupled to the high-side inverting buffer to receive the high-side control signal; and
   a gate of the NMOS transistor is operably coupled to the low-side buffer to receive the low-side control signal.

4. The level-shifting circuit of claim 3, further comprising a Zener diode operably coupled between the high-voltage source and an input to the high-side inverting buffer, wherein the Zener diode is configured to limit a voltage to be no greater than a maximum Vgs voltage of the high-side inverting buffer.

5. The level-shifting circuit of claim 3, wherein the edge-control buffer comprises a second NMOS transistor configured to control an input to the high-side inverting buffer, wherein a drain of the second NMOS transistor is operably coupled to the input of the high-side inverting buffer, a gate of the second NMOS transistor is operably coupled to an inverted input signal, and a source of the second NMOS transistor is operably coupled to a pull-down control current.

6. The level-shifting circuit of claim 5, wherein the pull-down control current is greater than the pull-up control current.

7. The level-shifting circuit of claim 1, wherein the low-side buffer comprises a turn-on delay operably coupled to an input of the pull-down circuit, wherein the turn-on delay is configured to delay the low-side control signal.

8. The level-shifting circuit of claim 5, wherein the edge-control buffer further comprises a speed-up capacitor operably coupled in parallel with the pull-down control current, wherein the speed-up capacitor is configured to drive a large current relative to the pull-up control current at a transition of the second NMOS transistor.

9. The level-shifting circuit of claim 8, wherein the edge-control buffer further comprises a discharge device operably coupled in parallel with the speed-up capacitor, wherein the discharge device is configured to discharge the speed-up capacitor in response to the input signal being asserted.

10. The level-shifting circuit of claim 1, wherein the low-voltage source is at least one of ground and a negative voltage.

11. The level-shifting circuit of claim 1, wherein the high-side inverting buffer comprises a multi-stage inverter configured to drive the high-side control signal.

12. The level-shifting circuit of claim 1, wherein the low-side buffer comprises an inverter configured to drive the low-side control signal.

13. The level-shifting circuit of claim 12, further comprising a low-side edge-control buffer operably coupled between the input signal and the low-side buffer and configured to generate a low-side edge-controlled signal with a fast rise time relative to a fall time of the low-side edge-controlled signal.

14. The level-shifting circuit of claim 1, wherein the high-side control signal and the low-side control signal have non-overlap timing of the rise times of the high-side control signal and the low-side control signal and of the fall times of the high-side control signal and the low-side control signal when alternatingly pulling up and pulling down the voltage on the output signal.

15. The level-shifting circuit of claim 1, wherein:
   the high-side inverting buffer and the low-side inverting buffer each comprise at least one low-voltage device, wherein the at least one low-voltage device of the high-side inverting buffer is configured to operate in a high-side low-voltage swing between the high-voltage source and a differential voltage less than the high-voltage source, and the at least one low-voltage device of the low-side buffer is configured to operate in a low-side low-voltage swing between the low-voltage source and a differential voltage above the low-voltage source; and the output circuit comprises at least one high-voltage device configured for operation at voltages above a safe Vgs voltage of the low-voltage devices.

16. A method for shifting an input voltage level to a different output voltage level, the method comprising:

generating an edge-controlled signal including mirroring a pull-up control current onto the edge-controlled signal, the edge-controlled signal exhibiting a slow rise time relative to a fall time of the edge-controlled signal;

generating a high-side control signal by inverting the edge-controlled signal, the high-side control signal controlling a pull-up device of an output circuit;

generating a low-side control signal controlling a pull-down device of the output circuit responsive to an inverted input signal; and toggling an output voltage level of an output voltage signal between a high-voltage level and a low-voltage level responsive to transitions of the high-side control signal and the low-side control signal.

17. The method of claim 16, wherein generating the high-side control signal and generating the low-side control signal includes generating non-overlap timing between rise times and between fall times of the high-side control signal and the low-side control signals when toggling the output voltage level of the output voltage signal.

18. The method of claim 16, further comprising delaying the generating the low-side control signal.

19. The method of claim 16, wherein generating the edge-controlled signal includes coupling the pull-down control current to the edge-controlled signal when a switch for activating the pull-up device is activated, wherein the pull-down control current is relatively greater than a pull-up control current.

20. The method of claim 19, wherein generating the edge-controlled signal includes coupling a speed-up capacitor to the switch controlling the pull-up device, the pull-down control current being proportional to a ratio of a capacitance of the speed-up capacitor and a parasitic capacitance.

21. The method of claim 20, further comprising actively discharging the speed-up capacitor in response to the input signal.

22. An integrated circuit, comprising:
a plurality of semiconductor devices; and
a level-shifting circuit, the level-shifting circuit comprising:
   a current mirror configured to mirror a pull-up control current onto an edge-controlled signal;
   a control gate comprising operably coupled to the current mirror and between the edge-controlled signal and a pull-down control current, and configured to pull-down the edge-controlled signal in response to an inverted input signal on the control gate;
   a high-side inverting buffer operably coupled to the current mirror between the edge-controlled signal and a high-side control signal;
   a low-side buffer configured for driving a low-side control signal responsive to the inverted input signal; and
   an output circuit operably coupled to the high-side inverting buffer and the low-side buffer, wherein the output circuit further comprises:
      a pull-up transistor operably coupled to the high-voltage source and configured for pulling up a voltage on an output signal in response to the high-side control signal; and
      a pull-down transistor operably coupled in series between the low-voltage source and the pull-up transistor, wherein the pull-down transistor is configured for pulling down the voltage on the output signal in response to the low-side control signal.

23. The integrated circuit of claim 22, wherein the high-side control signal and the low-side control signal have non-overlap timing of the rise times of the high-side control signal and the low-side control signal and of the fall times of the high-side control signal and the low-side control signal when alternatingly pulling up and pulling down the voltage on the output signal.

24. The integrated circuit of claim 22, wherein:
the current mirror, the high-side inverting buffer, and the low-side buffer each comprise at least one low-voltage device, wherein the at least one low-voltage device of the high-side inverting buffer is configured to operate in a high-side low-voltage swing between a high-voltage source and a differential voltage less than the high-voltage source, and the at least one low-voltage device of the low-side buffer is configured to operate in a low-side low-voltage swing between a low-voltage source and a differential voltage above the low-voltage source; and
the control gate and the output circuit each comprise at least one high-voltage device configured for operation at voltages above a safe Vgs voltage of the low-voltage devices.

* * * * *